(12) United States Patent
Kim et al.

(10) Patent No.: US 10,079,362 B2
(45) Date of Patent: Sep. 18, 2018

(54) ORGANIC LIGHT-EMITTING DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Jongwoo Kim, Yongin-si (KR); Heungkyoon Lim, Yongin-si (KR); Yongtack Kim, Yongin-si (KR); Jiyoung Moon, Yongin-si (KR); Minho Oh, Yongin-si (KR); Deokchan Yoon, Yongin-si (KR); Seungjae Lee, Yongin-si (KR); Yoonhyeung Cho, Yongin-si (KR); Jaeheung Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/008,035

(22) Filed: Jan. 27, 2016

(65) Prior Publication Data
US 2017/0018737 A1    Jan. 19, 2017

(30) Foreign Application Priority Data
Jul. 17, 2015  (KR) .................. 10-2015-0101987

(51) Int. Cl.
*H01L 51/00*  (2006.01)
*H01L 51/52*  (2006.01)
(Continued)

(52) U.S. Cl.
CPC ...... *H01L 51/5256* (2013.01); *H01L 27/3244* (2013.01); *H01L 51/0094* (2013.01);
(Continued)

(58) Field of Classification Search
CPC ............. H01L 51/5256; H01L 51/5253; H01L 51/5268; H01L 51/0094; H01L 27/3244;
(Continued)

(56) References Cited

U.S. PATENT DOCUMENTS 5,773,126 A    6/1998 Noritake et al.
9,515,025 B2 * 12/2016 Rogers ............... H01L 23/5387
(Continued)

FOREIGN PATENT DOCUMENTS

KR         10-0215330 B1    8/1999
KR    10-2006-0011347 A     2/2006
(Continued)

OTHER PUBLICATIONS

Kawamura, Y. et al., Observation of neodymium electroluminescence, Applied Physics Letters, May 31, 1999, pp. 3245-3247, vol. 74, No. 22, AIP Publishing, U.S.A.

(Continued)

*Primary Examiner* — Jarrett Stark
(74) *Attorney, Agent, or Firm* — Lewis Roca Rothgerber Christie LLP

(57) ABSTRACT

An organic light-emitting display device includes a substrate, a display unit on the substrate, and a thin film encapsulation unit configured to encapsulate the display unit, and including a corrugated portion including a first layer and a second layer that are sequentially stacked, wherein the first layer includes a material having a lower modulus of elasticity than the second layer, and wherein a corrugated surface is formed at an upper surface of the first layer and a lower surface of the second layer due to a difference in the moduli of elasticity of the first layer and the second layer.

11 Claims, 7 Drawing Sheets

(51) Int. Cl.
*H01L 51/56* (2006.01)
*H01L 27/32* (2006.01)

(52) U.S. Cl.
CPC ...... *H01L 51/5253* (2013.01); *H01L 51/5268* (2013.01); *H01L 51/56* (2013.01); *H01L 51/004* (2013.01); *H01L 51/005* (2013.01); *H01L 2227/323* (2013.01); *H01L 2251/301* (2013.01); *H01L 2251/303* (2013.01); *H01L 2251/5369* (2013.01); *H01L 2251/558* (2013.01)

(58) Field of Classification Search
CPC ............. H01L 51/56; H01L 2251/5369; H01L 2251/303; H01L 2251/301; H01L 2227/323; H01L 51/005; H01L 51/004
See application file for complete search history.

(56) References Cited

U.S. PATENT DOCUMENTS

| | | | |
|---|---|---|---|
| 9,821,507 B2* | 11/2017 | Saha | B29C 59/02 |
| 9,905,808 B2* | 2/2018 | Yang | H01L 51/5275 |
| 2004/0209487 A1* | 10/2004 | Choi | H01L 21/02164 438/788 |
| 2007/0267973 A1 | 11/2007 | Suh | |
| 2007/0273817 A1 | 11/2007 | Lee et al. | |
| 2008/0157235 A1* | 7/2008 | Rogers | H01L 21/8258 257/415 |
| 2011/0051054 A1* | 3/2011 | Wang | G02F 1/136277 349/106 |
| 2012/0217487 A1 | 8/2012 | Yamazaki et al. | |
| 2012/0248422 A1* | 10/2012 | Mine | H01L 51/5256 257/40 |
| 2012/0256201 A1* | 10/2012 | Lee | H01L 51/5268 257/88 |
| 2012/0267646 A1 | 10/2012 | Kim | |
| 2013/0143590 A1 | 6/2013 | Sridhara et al. | |
| 2013/0264595 A1 | 10/2013 | Hong et al. | |
| 2013/0293095 A1* | 11/2013 | Boerner | H01L 51/5231 313/504 |
| 2014/0017454 A1* | 1/2014 | Boyce | C09D 5/28 428/187 |
| 2014/0029267 A1* | 1/2014 | Moon | C07C 43/225 362/311.03 |
| 2014/0183462 A1 | 7/2014 | Lee et al. | |
| 2015/0069352 A1 | 3/2015 | Kim et al. | |
| 2015/0108435 A1* | 4/2015 | Huh | H01L 51/5256 257/40 |
| 2016/0056414 A1* | 2/2016 | Harikrishna Mohan | H01L 51/0097 257/40 |
| 2016/0305771 A1* | 10/2016 | Panat | G02B 6/021 |
| 2017/0018737 A1* | 1/2017 | Kim | H01L 51/5256 |

FOREIGN PATENT DOCUMENTS

| | | |
|---|---|---|
| KR | 10-0645693 B1 | 11/2006 |
| KR | 10-2007-0111002 A | 11/2007 |
| KR | 10-2012-0100751 A | 9/2012 |
| KR | 10-2012-0113555 A | 10/2012 |
| KR | 10-2012-0138037 | 12/2012 |
| KR | 10-2013-0098564 | 9/2013 |
| KR | 10-2013-0114996 A | 10/2013 |
| KR | 10-2013-0115027 A | 10/2013 |
| KR | 10-2013-0122602 A | 11/2013 |
| KR | 10-2013-0143590 A | 12/2013 |
| KR | 10-2014-0016125 | 2/2014 |
| KR | 10-2014-0088335 A | 7/2014 |

OTHER PUBLICATIONS

Zhang, Z. et al., High-Efficiency Phosphorescent White Organic Light-Emitting Diodes with Stable Emission Spectrum Based on RGB Separately Monochromatic Emission Layers, Chinese Physics Letters, 2014, vol. 31, No. 4, pp. 046801-1 to 046801-4, IOP Publishing Ltd., China.

* cited by examiner

ORGANIC LIGHT-EMITTING DISPLAY DEVICE AND METHOD OF MANUFACTURING THE SAME

CROSS-REFERENCE TO RELATED APPLICATION

This application claims priority to, and the benefit of, Korean Patent Application No. 10-2015-0101987, filed on Jul. 17, 2015, in the Korean Intellectual Property Office, the disclosure of which is incorporated herein in its entirety by reference.

BACKGROUND

1. Field

One or more exemplary embodiments relate to organic light-emitting display devices, and methods of manufacturing the organic light-emitting display devices.

2. Description of the Related Art

An organic light-emitting display device includes an organic light-emitting device that includes a hole injection electrode, an electron injection electrode, and an organic emissive layer therebetween. The organic light-emitting display device is a self-emissive display device configured to emit light when excitons, which are generated when holes injected to the hole injection electrode and electrons injected into the electron injection electrode combine with each other, fall from an excited state to a ground state.

The organic light-emitting display device is a self-emissive display device that does not require an additional light source, and thus may be driven at a low voltage, and may be lightweight and thin, and is regarded as a next-generation display device due to high definition characteristics, such as a wide angle of view, a high contrast, and a fast response speed.

SUMMARY

One or more exemplary embodiments include organic light-emitting display devices, and methods of manufacturing the organic light-emitting display devices.

Additional aspects will be set forth in part in the description which follows and, in part, will be apparent from the description, or may be learned by practice of the presented embodiments.

According to one or more exemplary embodiments, an organic light-emitting display device includes a substrate, a display unit on the substrate, and a thin film encapsulation unit configured to encapsulate the display unit, and including a corrugated portion including a first layer and a second layer that are sequentially stacked, wherein the first layer includes a material having a lower modulus of elasticity than the second layer, and wherein a corrugated surface is formed at an upper surface of the first layer and a lower surface of the second layer due to a difference in the moduli of elasticity of the first layer and the second layer.

The first layer may include an organic layer or an inorganic layer.

The second layer may include an organic layer or an inorganic layer.

The first layer may include one or more of acrylate, epoxy, silicone, or silicone acrylate.

The second layer may include one or more of SiNx, SiOx, SiON, SiCN, TiOx, WOx, SiOxCy, or SiOxCyHz.

The second layer may include one or more of acrylate, epoxy, silicone, or silicone acrylate.

The thin film encapsulation unit may further include a first inorganic layer, a first organic layer above the first inorganic layer, a second inorganic layer above the first organic layer, and a second organic layer above the second inorganic layer.

The corrugated portion may be under the first inorganic layer.

The corrugated portion may be between the first inorganic layer and the first organic layer.

The corrugated portion may be between the first organic layer and the second inorganic layer.

The corrugated portion may be on the second inorganic layer.

The thin film encapsulation unit may further include a second corrugated portion.

The first layer and the second layer may each include an organic-inorganic hybrid layer.

The first layer and the second layer may each include an organic-inorganic composite material including one or more of HMDSO, hexamethyldisilazane (HMDSN), tetrameyhyldisiloxane (TMDSO), tetraethyl orthosilicate (TEOS), octamethylcyclotetrasiloxane (OMCTS), or tetraoxymethylcyclotetrasiloxane (TOMCTS).

The corrugated surface may be irregular.

Curves of the corrugated surface may have a period of about 2 μm or less and a depth of about 4 μm or less.

According to one or more exemplary embodiments, a method of manufacturing an organic light-emitting display device includes forming a display unit on a substrate, and forming a thin film encapsulation unit to encapsulate the display unit by coating and hardening a first layer that planarizes a lower structure of the display unit, forming a second layer on the first layer, the second layer having a higher modulus of elasticity than the first layer, and stacking an organic layer or an inorganic layer on the second layer, wherein, in the forming the second layer, a corrugated surface is formed at an upper surface of the first layer and at a lower surface of the second layer due to a difference in moduli of elasticity of the first layer and the second layer.

The first layer and the second layer may each include an organic layer or an inorganic layer.

The first layer and the second layer may each include an organic-inorganic hybrid layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
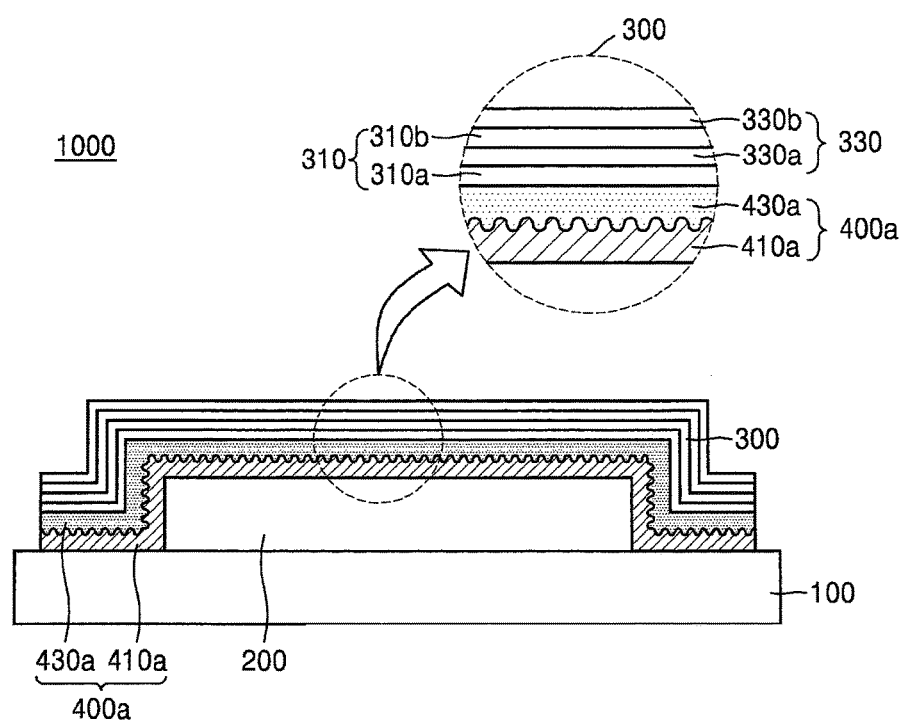
FIG. 1 is a schematic cross-sectional view of an organic light-emitting display device according to an exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
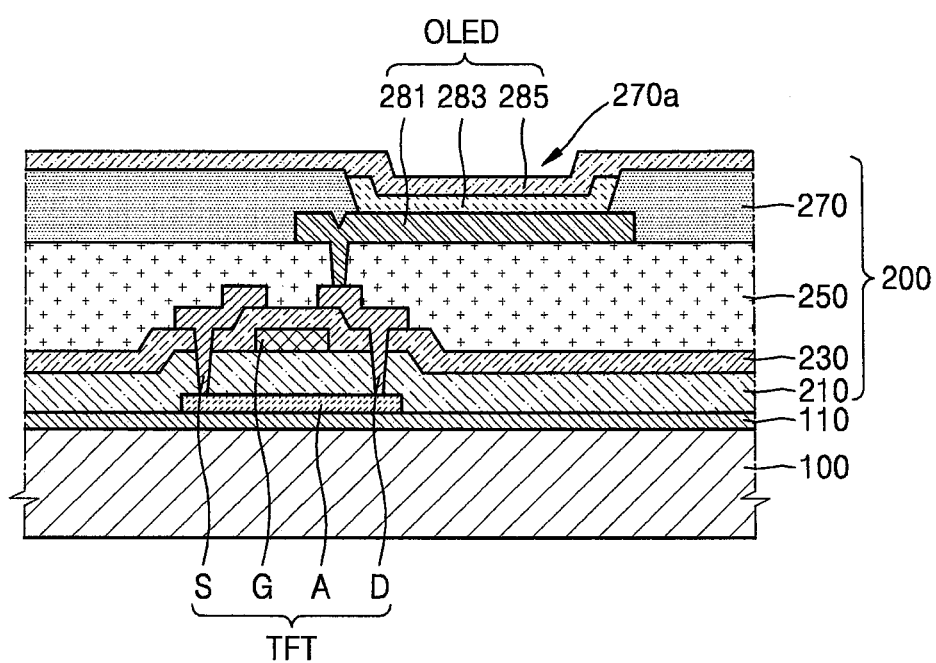
FIG. 2 is a schematic cross-sectional view of a display unit according to an exemplary embodiment.

FIG. 1 is a schematic cross-sectional view of an organic light-emitting display device 1000 according to an exemplary embodiment, FIG. 2 is a schematic cross-sectional view of a display unit 200 according to an exemplary embodiment.

The organic light-emitting display device 1000 according to the present exemplary embodiment may include a substrate 100, the display unit 200 formed on the substrate 100, and a thin film encapsulation unit 300 encapsulating the display unit 200.

The substrate 100 may include various materials. For example, the substrate 100 may include a glass material or another insulation material, or a metal thin film. According to one embodiment, the substrate 100 may include at least one of silicone-based polymer, polyurethane, polyurethane acrylate, acrylate polymer, and acrylate terpolymer. The silicone-based polymer may include, for example, polydimethylsiloxane (PDMS) or hexamethyldisiloxane (HMDSO).

The display unit 200 is formed on the substrate 100, and is configured to generate visible rays of light that a user may view. As illustrated in FIG. 2, the display unit 200 includes an organic light-emitting device OLED in the present exemplary embodiment.

The organic light-emitting device OLED may include a first electrode 281, an intermediate layer 283 including an organic emissive layer, and a second electrode 285.

The first electrode 281 and the second electrode 285 may be formed using various conductive materials. According to one embodiment, the first electrode 281 and/or the second electrode 285 may include a light-transmissive material or a reflective material. Examples of the light-transmissive material may include ITO, IZO, ZnO, and $In_2O_3$, and examples of the reflective material may include Ag, Mg, Al, Pt, Pd, Au, Ni, Nd, Ir, Cr, and compounds thereof.

The intermediate layer 283 may be formed between the first electrode 281 and the second electrode 285, and may include the organic emissive layer. According to one embodiment, the intermediate layer 283 may include an organic emissive layer, and may further include at least one of a hole injection layer (HIL), a hole transport layer (HTL), an electron transport layer (ETL), and an electron injection layer (EIL). However, the exemplary embodiment is not limited thereto, and the intermediate layer 283 may include an organic emissive layer and also other various functional layers.

As illustrated in FIG. 1, according to the present exemplary embodiment, the organic light-emitting display device 1000 may include the thin film encapsulation unit 300 to completely encapsulate the display unit 200 to protect the display unit 200 from external moisture or oxygen.

According to one embodiment, the thin film encapsulation unit 300 may be formed on the display unit 200, and two ends of the thin film encapsulation unit 300 may be closely adhered to the substrate 100 at sides of the display unit 200.

According to one embodiment, the thin film encapsulation unit 300 may have a structure in which multiple thin films are stacked, that is, in which an inorganic layer 310 and an organic layer 330 are alternately stacked.

According to one embodiment, as illustrated in FIG. 1, the thin film encapsulation unit 300 may be formed by sequentially stacking a first inorganic layer 310a, a first organic layer 330a, a second inorganic layer 310b, and a second organic layer 330b (in this order). However, the number of thin films is not limited thereto, and a plurality of thin films may be alternately stacked to form the thin film encapsulation unit 300.

The inorganic layer 310 may firmly prevent penetration of oxygen or moisture, and the organic layer 330 may absorb stress applied to the inorganic layer 310 to add flexibility to the organic light-emitting display device 1000.

The inorganic layer 310 may be a single layer or a multi-layer structure including a metal oxide or a metal nitride. According to one embodiment, the inorganic layer 310 may include one of SiNx, $Al_2O_3$, $SiO_2$, and $TIO_2$.

The organic layer 330 includes polymer. For example, the organic layer 330 may be a single layer or a multi-layer structure including one of polyethylene terephthalate, polyimide, polycarbonate, epoxy, polyethylene, and polyacrylate. For example, the organic layer 330 may include polyacrylate. In detail, the organic layer 330 may include a polymerized monomer composition including a diacrylate-based monomer and a triacrylate-based monomer. The monomer composition may further include a monoacrylate-based monomer. Also, the monomer composition may further include a photo-initiator, such as TPO, but is not limited thereto.

According to one embodiment, a corrugated portion 400a may be included in the thin film encapsulation unit 300. The corrugated portion 400a may be formed by sequentially stacking two layers. That is, the corrugated portion 400a is included in the thin film encapsulation unit 300 that encapsulates the display unit 200, and the corrugated portion 400a may be formed by first forming a first layer 410a and then immediately stacking a second layer 430a on the first layer 410a.

According to one embodiment, as illustrated in FIG. 1, the corrugated portion 400a may be located in the thin film encapsulation unit 300, and may be formed under the first inorganic layer 310a. That is, according to the organic light-emitting display device 1000 of the present exemplary embodiment, the first layer 410a, the second layer 430a, the first inorganic layer 310a, the first organic layer 330a, the second inorganic layer 310b, and the second organic layer 330b may be sequentially stacked, in that order, to encapsulate the display unit 200.

According to one embodiment, the first layer 410a may include a material, having a lower modulus of elasticity than the second layer 430a, and the second layer 430a may include a material having a higher modulus of elasticity than the first layer 410a formed therebelow. According to the organic light-emitting display device 1000 of the present exemplary embodiment, as a material having a relatively low modulus of elasticity is formed in contact with a material having a relatively high modulus of elasticity, a curved surface (e.g., an irregular surface, an uneven surface, a corrugated surface, or a rippled surface) may be formed between two layers due to the difference in the moduli of elasticity of the two layers. That is, without having to additionally form a curve, as the first layer 410a is formed, and as the second layer 430a is then formed on the first layer 410a to contact the first layer 410a, a curved surface may spontaneously form on an upper surface of the first layer 410a and on a lower surface of the second layer 430a due to thin film stresses. According to one embodiment, the curved surface does not have a regular periodic structure or a regular shape, but may be an irregular surface.

According to the organic light-emitting display device 1000 of the present exemplary embodiment, the corrugated portion 400a is formed inside the thin film encapsulation unit 300. That is, a curved surface is formed between the first layer 410a and the second layer 430a, and thus, lateral visibility (WAD) of the organic light-emitting display device 1000 may be improved as light emitted from the display unit 200 is transmitted to the outside and perceived by the eyesight of the user. In other words, light emitted from the display unit 200 may arrive at the curved surface of the corrugated portion 400a formed in the thin film encapsulation unit 300, and may be irregularly refracted by the curved surface having an irregular form. Accordingly, unlike a display device in which light is transmitted only linearly, and thus has poor lateral visibility (WAD), the exemplary embodiment allows light to be refracted at various angles via the curved surface, and thus the lateral visibility (WAD) may be improved.

According to one embodiment, a corrugation formed by the curved surface may have a period of about 2 μm or less and a depth of about 4 μm or less. When a curved surface is formed in the corrugated portion 400a according to the present exemplary embodiment, the efficiency of improving lateral visibility due to refraction of light may be maximized. However, the form of the corrugated portion 400a is not limited thereto, and an irregular corrugation may be formed based on a difference between moduli of elasticity of the first layer 410a and the second layer 430a.

The first layer 410a and the second layer 430a may each include an organic layer or an inorganic layer. When forming a layer by depositing an organic material or an inorganic material, a modulus of elasticity of the layer may vary depending on the conditions surrounding the forming of the layer by using a material instead of a unique value of the material. That is, when depositing a layer, a modulus of elasticity of the layer formed may vary according to various formation conditions, such as a condition of ambient oxygen, a pressure condition, a power condition, or a gap between electrodes. Thus, even when the first layer 410a and the second layer 430a include identical materials, a modulus of elasticity of a layer may be adjusted according to conditions of forming a layer, and, by adjusting the conditions, the first layer 410a may have a low modulus of elasticity while the second layer 430a may have a high modulus of elasticity.

According to one embodiment, the first layer 410a may include an organic layer having a relatively low modulus of elasticity, and the second layer 430a may include an organic layer having a relatively high modulus of elasticity. According to another embodiment, the first layer 410a may include an organic layer having a relatively low modulus of elasticity, and the second layer 430a may include an inorganic layer having a relatively high modulus of elasticity. According to one embodiment, the first layer 410a may include an inorganic layer having a relatively low modulus of elasticity, and the second layer 430a may include an organic layer having a relatively high modulus of elasticity. And according to another embodiment, the first layer 410a may include an inorganic layer having a relatively low modulus of elasticity, and the second layer 430a may include an inorganic layer having a relatively high modulus of elasticity.

As long as a modulus of elasticity of the first layer 410a is lower than that of the second layer 430a formed on the first layer 410a (i.e., a modulus of elasticity of the second layer 430a is higher than that of the first layer 410a formed under the second layer 430a), the first layer 410a and the second layer 430a may include any material without being limited to an organic layer or an inorganic layer.

According to one embodiment, if the first layer 410a includes an organic layer, the first layer 410a may include an organic material that is acrylate, epoxy, silicone, and silicone acrylate. According to another embodiment, if the first layer 410a includes an inorganic layer, the first layer 410a may include an inorganic material that is one of SiNx, SiOx, SiON, SiCN, TiOx, WOx, SiOxCy, and SiOxCyHz. According to one embodiment, if the second layer 430a includes an organic layer, the second layer 430a may include an organic material that is acrylate, epoxy, silicone, and silicone acrylate. And according to another embodiment, if the second layer 430a includes an inorganic layer, the second layer 430a may include an inorganic material that is one of SiNx, SiOx, SiON, SiCN, TiOx, WOx, SiOxCy, and SiOxCyHz.

Referring to FIG. 2, the display unit 200 includes a thin film transistor TFT and an organic light-emitting device OLED, which will be described in detail.

A buffer layer 110 may be formed on the substrate 100. The buffer layer 110 reduces or prevents diffusion of impurity ions into the organic light-emitting device OLED, reduces or prevents penetration of moisture or external air into the organic light-emitting device OLED, and may function as a barrier layer and/or a blocking layer to planarize a surface of the substrate 100.

The thin film transistor TFT may be formed on the buffer layer 110. An active layer A of the thin film transistor TFT may include polysilicon, and may include a channel area, a source area, and a drain area. The type of impurity may vary depending on the type of the thin film transistor TFT, and may be N-type impurities or P-type impurities.

After the active layer A is formed, a gate insulation layer 210 may be formed on the active layer A over the entire surface of the substrate 100. The gate insulation layer 210 may include a multi-layer structure, or may include a single layer including an inorganic material, such as a silicon oxide or a silicon nitride. The gate insulation layer 210 insulates the active layer A from a gate electrode G that is located on/over the active layer A.

After forming the gate insulation layer 210, the gate electrode G may be formed on the gate insulation layer 210. The gate electrode G may be formed using a photolithography process and an etching process. The gate electrode G may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), titanium (Ti), tungsten (W), and copper (Cu).

After the gate electrode G is formed, a first interlayer insulation layer 230 may be formed over the entire surface of the substrate 100. The first interlayer insulation layer 230 may include an inorganic material. For example, the first interlayer insulation layer 230 may be a metal oxide or a metal nitride, and examples of the organic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZrO_2$). The first interlayer insulation layer 230 may include a multi-layer structure, or may include a single layer including an inorganic material, such as silicon oxide (SiOx) and/or silicon nitride ($ZrO_2$). In some exemplary embodiments, the first interlayer insulation layer 230 may have a double structure of SiOx/SiNy or SiNx/SiOy.

A source electrode S and a drain electrode D of the thin film transistor TFT may be located on the first interlayer insulation layer 230. The source electrode S and the drain electrode D may each include at least one metal selected from aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

A via layer 250 is formed over the entire surface of the substrate 100, and covers the source electrode S and the drain electrode. The first electrode 281 may be formed on the via layer 250. According to the exemplary embodiment of FIG. 2, the first electrode 281 is connected to the drain electrode D via a via hole.

The via layer 250 may include an insulation material. For example, the via layer 250 may include an inorganic material, an organic material, or an organic/inorganic composite material, and may be a single layer or a multi-layer structure, and may be formed by using various deposition methods. In some embodiments, the via layer 250 may include at least one material from among an acrylic resin (polyacrylate resin), an epoxy resin, a phenolic resin, a polyamides resin, a polyimide resin, an unsaturated polyesters resin, a polyphenylene ether resin, a polyphenylene sulfide resin, and a benzocyclobutene (BCB).

The organic light-emitting device OLED is included on the via layer 250. The organic light-emitting device OLED includes the first electrode 281, the intermediate layer 283 including an organic emissive layer, and the second electrode 285. Also, the organic light-emitting device OLED may further include, or may be surrounded by, a pixel-defining layer 270.

The first electrode 281 and/or the second electrode 285 may include a transparent electrode or a reflective electrode. When the first electrode 281 and/or the second electrode 285 include a transparent electrode, the first electrode 281 and/or the second electrode 285 may include ITO, IZO, ZnO or $In_2O_3$. When the first electrode 281 and/or the second electrode 285 include a reflective electrode, the first electrode 281 and/or the second electrode 285 may include a reflective layer including Ag, Mg, Al, Pt, Pd, Au, Ni, Nd, Ir, Cr or a compound thereof, and may also include a transparent layer including ITO, IZO, ZnO or $In_2O_3$. In some exemplary embodiments, the first electrode 281 or the second electrode 285 may have an ITO/Ag/ITO structure.

The pixel-defining layer 270 may define a pixel area and a non-pixel area. The pixel-defining layer 270 may include an opening 270a for partially exposing the first electrode 281, and may cover the entire surface of the substrate 100. The intermediate layer 283, which will be described later, is formed in the opening 270a so that the opening 270a may substantially function as, or correspond to, a pixel area.

Figure 3:
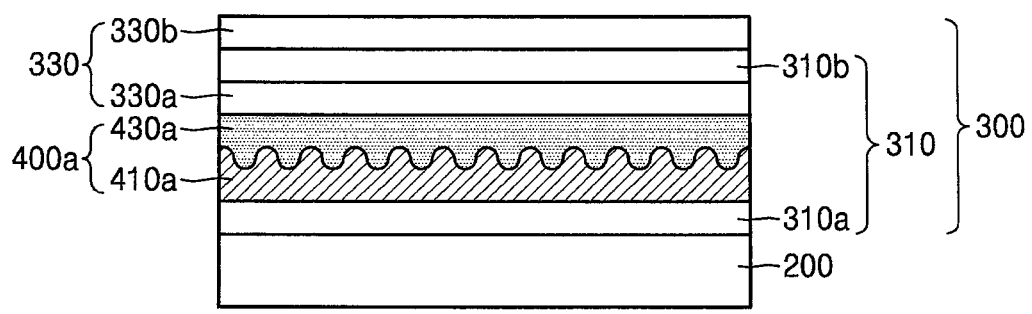
FIG. 3 is a schematic cross-sectional view of a portion of an organic light-emitting display device according to another exemplary embodiment.

FIG. 3 is a schematic cross-sectional view of a portion of an organic light-emitting display device according to another exemplary embodiment. In FIG. 3, like reference numerals that are the same as those of FIGS. 1 and 2 denote like elements, and repeated description thereof will be omitted here for simplicity of description.

A thin film encapsulating unit 300 may be formed on a display unit 200 to encapsulate the display unit 200, and the thin film encapsulation unit 300 may include an inorganic layer 310, an organic layer 330, and a corrugated portion 400a. According to one embodiment, the thin film encapsulation unit 300 may have a structure in which multiple thin films are stacked, that is, in which the inorganic layer 310 and the organic layer 330 are alternately stacked.

According to one embodiment, as illustrated in FIG. 3, the thin film encapsulation unit 300 may be formed by sequentially stacking a first inorganic layer 310a, a first organic layer 330a, a second inorganic layer 310b, and a second organic layer 330b in order. The number of thin films is not limited thereto, and a plurality of thin films may be alternately stacked to form the thin film encapsulation unit 300.

According to one embodiment, the corrugated portion 400a may be formed between the first inorganic layer 310a and the first organic layer 330a. The corrugated portion 400a may include a first layer 410a at a lower portion, and a second layer 430a that is formed immediately above the first layer 410a.

According to one embodiment, the first layer 410a may include a material having a lower modulus of elasticity than the second layer 430a, and the second layer 430a may include a material having a higher modulus of elasticity than the first layer 410a.

According to the organic light-emitting display device of the present exemplary embodiment, as a material having a relatively low modulus of elasticity is formed at a lower portion and in contact with a material having a relatively high modulus of elasticity that is at an upper portion, a curved/rippled/irregular/uneven/corrugated surface may be formed between two layers due to a difference in the moduli of elasticity of the two layers.

That is, a curved surface may be spontaneously formed at an upper surface of the first layer 410a and at a lower surface of the second layer 430a, which is on the first layer 410a, due to thin film stresses, and without performing an additional process.

According to one embodiment, the curved surface does not have a regular periodic structure, or a regular shape, but may be an irregular surface.

According to the organic light-emitting display device of the present exemplary embodiment, a curved surface is formed inside the corrugated portion 400a, which is formed inside the thin film encapsulation unit 300. That is, a curved surface is formed between the first layer 410a and the second layer 430a, and thus, lateral visibility (WAD) may be improved as light emitted from the display unit 200 is transmitted to the outside to be perceived by the eyesight of the user. In other words, light emitted from the display unit 200 may arrive at the curved surface of the corrugated portion 400a formed in the thin film encapsulation unit 300, and may be irregularly refracted by the curved surface having an irregular form.

Accordingly, unlike a display device in which light is transmitted only linearly, and thus has poor lateral visibility (WAD), according to the exemplary embodiment, light may be refracted at various angles via the curved surface, and thus the lateral visibility (WAD) may be improved.

The first layer 410a and the second layer 430a may each include an organic layer or an inorganic layer. That is, the first layer 410a and the second layer 430a may include any material including an organic layer or an inorganic layer, provided that a modulus of elasticity of the first layer 410a is lower than that of the second layer 430a on the first layer 410a (i.e., a modulus of elasticity of the second layer 430a is higher than that of the first layer 410a underneath the second layer 430a). That is, in the organic light-emitting display device according to the present exemplary embodiment, the first inorganic layer 310a, the corrugated portion 400a (i.e., the first layer 410a and the second layer 430a), the first organic layer 330a, the second inorganic layer 310b, and the second organic layer 330b may be sequentially stacked so as to encapsulate the display unit 200.

Figure 4:
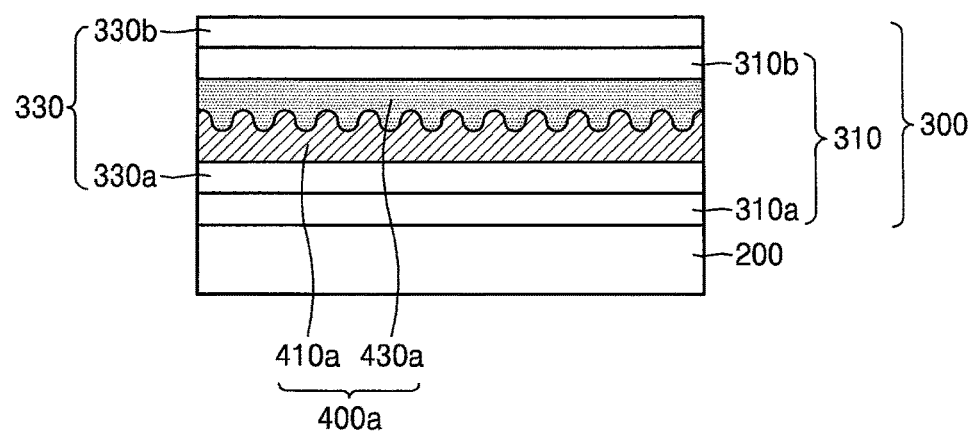
FIG. 4 is a schematic cross-sectional view of a portion of an organic light-emitting display device according to another exemplary embodiment.

FIG. 4 is a schematic cross-sectional view of a portion of an organic light-emitting display device according to another exemplary embodiment. In FIG. 4, like reference numerals that are the same as those of FIGS. 1 and 2 denote like elements, and repeated description thereof will be omitted here for simplicity of description.

A thin film encapsulating unit 300 may be formed on a display unit 200 to encapsulate the display unit 200, and the thin film encapsulation unit 300 may include an inorganic layer 310, an organic layer 330, and a corrugated portion 400a. According to one embodiment, the thin film encapsulation unit 300 may have a structure in which multiple thin films are stacked, that is, in which the inorganic layer 310 and the organic layer 330 are alternately stacked.

According to one embodiment, as illustrated in FIG. 4, the thin film encapsulation unit 300 may be formed by sequentially stacking a first inorganic layer 310a, a first organic layer 330a, a second inorganic layer 310b, and a second organic layer 330b. The number of thin films is not limited thereto, and a plurality of thin films may be alternately stacked to form the thin film encapsulation unit 300.

According to the present embodiment, the corrugated portion 400a may be formed between the first organic layer 330a and the second inorganic layer 310b. The corrugated portion 400a may include a first layer 410a at a lower portion, and a second layer 430a that is formed directly on the first layer 410a.

According to one embodiment, the first layer 410a may include a material having a lower modulus of elasticity than the second layer 430a (i.e., the second layer 430a may include a material having a higher modulus of elasticity than the first layer 410a).

According to the organic light-emitting display device of the present exemplary embodiment, as a material having a relatively low modulus of elasticity is formed at a lower portion, and in contact with a material having a relatively high modulus of elasticity formed at an upper portion, a curved/rippled/uneven/irregular/corrugated surface may be formed between two layers due to a difference in the moduli of elasticity of the two layers.

That is, a curved surface may be spontaneously formed on an upper surface of the first layer 410a and at a lower surface of the second layer 430a, which is on the first layer 410a, due to thin film stresses and without performing an additional process.

According to one embodiment, the curved surface does not have a regular periodic structure or a regular shape, but may be an irregular surface.

According to the organic light-emitting display device of the present exemplary embodiment, as illustrated in FIG. 4, a curved surface is formed within the corrugated portion 400a, which is formed inside the thin film encapsulation unit 300.

That is, a curved surface is formed between the first layer 410a and the second layer 430a of the corrugated portion 400a, and thus, lateral visibility (WAD) may be improved as light emitted from the display unit 200 is transmitted to the outside to be perceived by the eyesight of the user. In other words, light emitted from the display unit 200 may arrive at the curved surface of the corrugated portion 400a formed in the thin film encapsulation unit 300, and may then be irregularly refracted by the curved surface having an irregular form.

Accordingly, unlike a display device in which light is transmitted just only linearly, and thus has poor lateral visibility (WAD), according to the exemplary embodiment, light may be refracted at various angles via the curved surface, and thus the lateral visibility (WAD) may be improved.

The first layer 410a and the second layer 430a may each include an organic layer or an inorganic layer. That is, the first layer 410a and the second layer 430a may include any material including an organic material or an inorganic material, provided that a modulus of elasticity of the first layer 410a is lower than that of the second layer 430a, which is formed on the first layer 410a (i.e., a modulus of elasticity of the second layer 430a is higher than that of the first layer 410a formed directly underneath the second layer 430a).

That is, in the organic light-emitting display device according to the present exemplary embodiment, the first inorganic layer 310a, the first organic layer 330a, the corrugated portion 400a including the first layer 410a and the second layer 430a, the second inorganic layer 310b, and the second organic layer 330b may be sequentially stacked to encapsulate the display unit 200.

Figure 5:
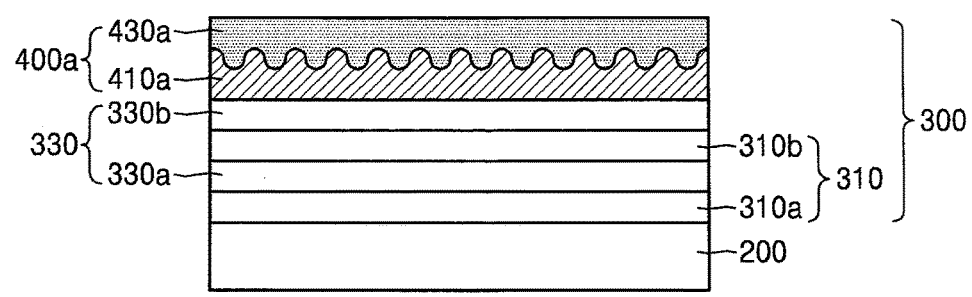
FIG. 5 is a schematic cross-sectional view of a portion of an organic light-emitting display device according to another exemplary embodiment.

FIG. 5 is a schematic cross-sectional view of a portion of an organic light-emitting display device according to another exemplary embodiment. In FIG. 5, like reference numerals that are the same as those of FIGS. 1 and 2 denote like elements, and repeated description thereof will be omitted here for simplicity of description.

A thin film encapsulating unit 300 may be formed on a display unit 200 to encapsulate the display unit 200, and the thin film encapsulation unit 300 may include an inorganic layer 310, an organic layer 330, and a corrugated portion 400a.

According to one embodiment, the thin film encapsulation unit 300 may have a structure in which multiple thin films are stacked, that is, in which the inorganic layer 310 and the organic layer 330 are alternately stacked.

According to one embodiment, as illustrated in FIG. 5, the thin film encapsulation unit 300 may be formed by sequentially stacking a first inorganic layer 310a, a first organic layer 330a, a second inorganic layer 310b, and a second organic layer 330b. The number of thin films is not limited thereto, and a plurality of thin films may be alternately stacked to form the thin film encapsulation unit 300.

According to the present embodiment, the corrugated portion 400a may be formed on the second organic layer 330b. That is, after the inorganic layer 310 and the organic layer 330 are both stacked, the corrugated portion 400a may be formed at an uppermost portion of the thin film encapsulation unit 300.

The corrugated portion 400a may include a first layer 410a at a lower portion, and a second layer 430a that is formed directly on the first layer 410a. According to the present embodiment, the first layer 410a may include a material having a lower modulus of elasticity than the second layer 430a (i.e., the second layer 430a may include a material having a higher modulus of elasticity than the first layer 410a).

According to the organic light-emitting display device of the present exemplary embodiment, as a material having a relatively low modulus of elasticity is formed at a lower portion of, and in contact with, a material having a relatively high modulus of elasticity at an upper portion, a curved/irregular/uneven/rippled/corrugated surface may be formed between the two layers. That is, a curved surface may spontaneously form at an upper surface of the first layer 410a and at a lower surface of the second layer 430a, which is on the first layer 410a, due to thin film stresses, and without performing an additional process. The curved surface might not have a regular periodic structure or a regular shape, but may be an irregular surface.

According to the organic light-emitting display device of the present exemplary embodiment, as illustrated in FIG. 5, a curved surface is formed inside the corrugated portion 400a formed inside the thin film encapsulation unit 300, and thus, lateral visibility (WAD) may be improved as light emitted from the display unit 200 is transmitted to the outside and perceived by the eyesight of the user. In other words, light emitted from the display unit 200 may arrive at the curved surface of the corrugated portion 400a, which is formed in (or on) the thin film encapsulation unit 300, and the emitted light may be irregularly refracted by the curved surface having an irregular form. Accordingly, and unlike a display device in which light is transmitted only linearly, and thus has poor lateral visibility (WAD), in the present embodiment, light may be refracted at various angles via the curved surface, and thus the lateral visibility (WAD) may be improved.

The first layer 410a and the second layer 430a may each include an organic layer or an inorganic layer. That is, the first layer 410a and the second layer 430a may include any material including an organic material or an inorganic material, provided that a modulus of elasticity of the first layer 410a is lower than that of the second layer 430a (i.e., a modulus of elasticity of the second layer 430a is higher than that of the first layer 410a). That is, in the organic light-emitting display device according to the present exemplary embodiment, the first inorganic layer 310a, the first organic layer 330a, the second inorganic layer 310b, the second organic layer 330b, and the corrugated portion 400a, which includes the first layer 410a and the second layer 430a, may be sequentially stacked to encapsulate the display unit 200.

Figure 6:
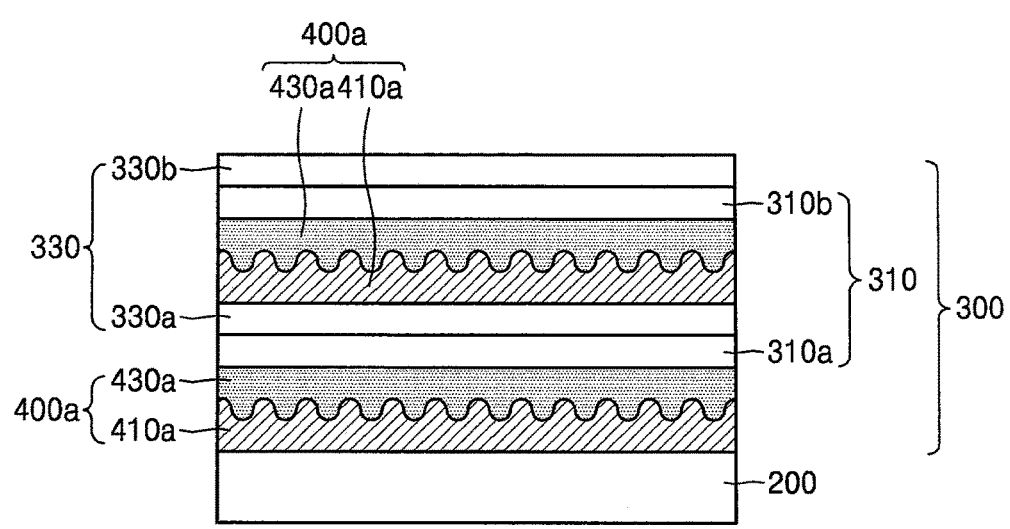
FIG. 6 is a schematic cross-sectional view of a portion of an organic light-emitting display device according to another exemplary embodiment.

FIG. 6 is a schematic cross-sectional view of a portion of an organic light-emitting display device according to another exemplary embodiment. In FIG. 6, like reference numerals that are the same as those of FIGS. 1 and 2 denote like elements, and repeated description thereof will be omitted here for simplicity of description.

A thin film encapsulating unit 300 may be formed on a display unit 200 to encapsulate the display unit 200, and the thin film encapsulation unit 300 may include an inorganic layer 310, an organic layer 330, and a corrugated portion 400a. According to one embodiment, the thin film encapsulating unit 300 may have a structure in which multiple thin films are stacked, that is, in which the inorganic layer 310 and the organic layer 330 are alternately stacked.

According to the present embodiment, as illustrated in FIG. 6, the thin film encapsulation unit 300 may be formed with a first inorganic layer 310a, a first organic layer 330a, a second inorganic layer 310b, and a second organic layer 330b. The number of thin films is not limited thereto, and a plurality of thin films may be alternately stacked to form the thin film encapsulation unit 300. According to the present embodiment, at least two corrugated portions 400a may be formed in the thin film encapsulation unit 300.

Each of the corrugated portions 400a may include a first layer 410a at a lower portion, and a second layer 430a formed directly on the first layer 410a. That is, at least two first layers 410a and at least two second layers 430a may be formed. According to the present embodiment, the first layer 410a may include a material having a lower modulus of elasticity than the second layer 430a (i.e., the second layer 430a may include a material having a higher modulus of elasticity than the first layer 410a).

According to the organic light-emitting display device of the present exemplary embodiment, when a material having a relatively low modulus of elasticity is formed at a lower portion of, and in contact with, a material having a relatively high modulus of elasticity in an upper portion, a curved surface may be formed between two layers due to a difference in the moduli of elasticity of the materials of the two layers.

That is, a curved/irregular/uneven/rippled/corrugated surface may spontaneously form at an upper surface of the first layer 410a, and at a lower surface of the second layer 430a thereon, due to thin film stresses, and without performing an additional process.

According to one embodiment, the curved surface does not have a regular periodic structure or a regular shape, but may be an irregular surface.

According to the organic light-emitting display device of the present exemplary embodiment, at least two corrugated portions 400a may be formed in the thin film encapsulation unit 300.

Referring to FIG. 6, the thin film encapsulation unit 300 including two corrugated portions 400a is illustrated, and the corrugated portions 400a are respectively formed below the first inorganic layer 310a, and between the first organic layer 330a and the second inorganic layer 310b.

The number of corrugated portions 400a is not limited thereto, and the corrugated portions 400a may be formed at any position in the thin film encapsulation unit 300 without limitation.

According to the organic light-emitting display device of the present exemplary embodiment, as illustrated in FIG. 6, at least two curved surfaces are formed inside the corrugated portions 400a formed inside the thin film encapsulation unit 300, and thus, lateral visibility (WAD) may be improved as light emitted from the display unit 200 is transmitted to the outside and perceived by the eyesight of the user.

In other words, light emitted from the display unit 200 may arrive at the curved surfaces formed in the thin film encapsulation unit 300, and may be irregularly refracted by the curved surfaces having an irregular form.

As the at least two corrugated portions 400a are formed in the organic light-emitting display device according to the present exemplary embodiment, curved surfaces are also formed at least two positions, thereby allowing irregular and repeated refraction of light, and thereby increasing the efficiency of improving lateral visibility (WAD). That is, unlike a display device in which light is transmitted only linearly, and thus has poor lateral visibility (WAD), according to the present embodiment, light may be refracted at various angles via the curved surfaces, and thus lateral visibility (WAD) may be improved.

The first layer 410a and the second layer 430a may each include an organic layer or an inorganic layer. That is, the first layer 410a and the second layer 430a may include any material including an organic material or an inorganic material, provided that a modulus of elasticity of the first layer 410a is lower than that of the second layer 430a (i.e., a modulus of elasticity of the second layer 430a is higher than that of the first layer 410a).

In addition, when a plurality of first layers 410a and a plurality of second layers 430a are formed, each layer may include materials without being limited to an organic layer or an inorganic layer. According to the present embodiment, when two first layers 410a and two second layers 430a are formed, the first layer 410a that is lowest of the two first layers 410a may include an organic layer, and the first layer 410a that is highest may include an inorganic layer. That is, as long as the first layer 410a of the corrugated portion 400a has a lower modulus of elasticity than the second layer 430a of the corrugated portion 400a (i.e., the second layer 430a has a higher modulus of elasticity than the first layer 410a), the first layer 410a and the second layer 430a may include any material without limitation to a type of materials.

That is, in the organic light-emitting display device according to the present exemplary embodiment, the first corrugated portion 400a including the first layer 410a and the second layer 430a, the first inorganic layer 310a, the first organic layer 330a, the second corrugated portion 400a including the other first layer 410a and the other second layer 430a, the second inorganic layer 310b, and the second organic layer 330b may be sequentially stacked to encapsulate the display unit 200.

Figure 7:
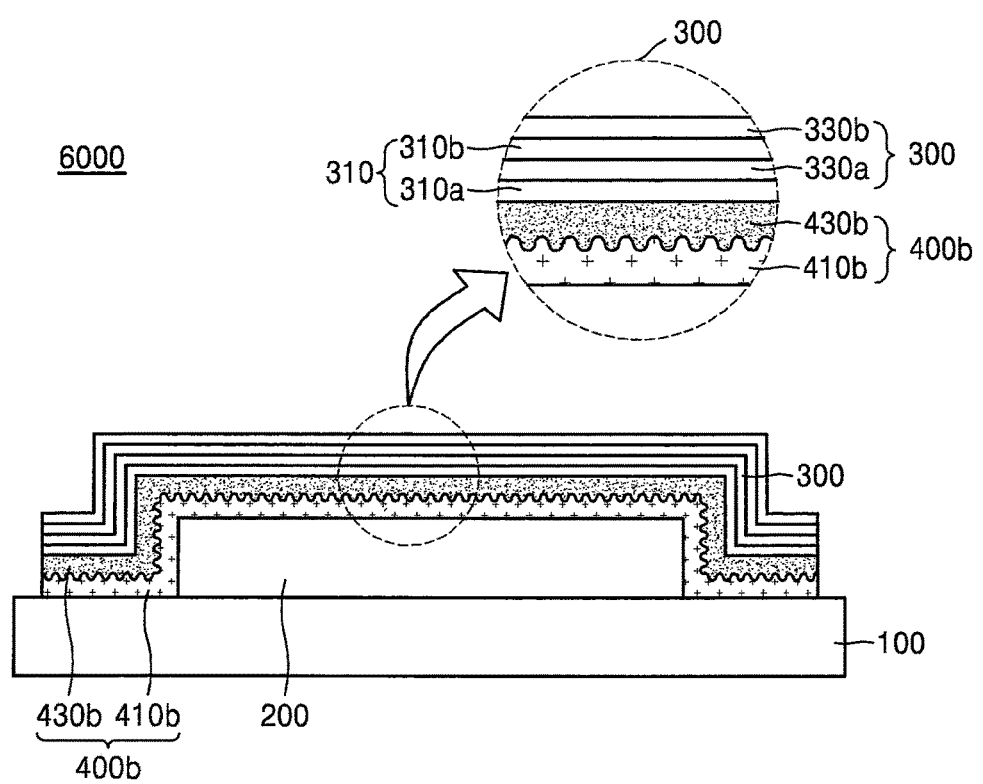
FIG. 7 is a schematic cross-sectional view of an organic light-emitting display device according to another exemplary embodiment.

FIG. 7 is a schematic cross-sectional view of an organic light-emitting display device 6000 according to another exemplary embodiment. In FIG. 7, like reference numerals that are the same as those of FIGS. 1 and 2 denote like elements, and repeated description thereof will be omitted here for simplicity of description.

The organic light-emitting display device 6000 according to the present exemplary embodiment may include a substrate 100, a display unit 200 on the substrate 100, and a thin film encapsulation unit 300 encapsulating the display unit 200.

The thin film encapsulation unit 300 encapsulating the display unit 200 may be formed on the display unit 200, and the thin film encapsulation unit 300 may include an inorganic layer 310, an organic layer 330, and a corrugated portion 400b. According to one embodiment, the thin film encapsulation unit 300 may have a structure in which multiple thin films are stacked, that is, in which the inorganic layer 310 and the organic layer 330 are alternately stacked.

According to the present embodiment, as illustrated in FIG. 7, the thin film encapsulation unit 300 may be formed by sequentially stacking a first inorganic layer 310a, a first organic layer 330a, a second inorganic layer 310b, and a second organic layer 330b. The number of thin films is not limited thereto, and a plurality of thin films may also be alternately stacked to form the thin film encapsulation unit 300.

According to one embodiment, the corrugated portion 400b may be formed under the first inorganic layer 310a. However, a position of the corrugated portion 400b is not limited thereto. The corrugated portion 400b may be formed at any position, for example, between the first inorganic layer 310a and the first organic layer 330a, or on the second organic layer 330b.

The corrugated portion 400b may include a first layer 410b at a lower portion, and a second layer 430b formed directly on the first layer 410b. According to one embodiment, the first layer 410a may include a material having a lower modulus of elasticity than the second layer 430a thereon (i.e., the second layer 430a may include a material having a higher modulus of elasticity than the first layer 410a formed therebelow).

According to the organic light-emitting display device 6000 of the present exemplary embodiment, as a material having a relatively low modulus of elasticity is formed at a lower portion of, and in contact with, a material having a relatively high modulus of elasticity at an upper portion, a curved/rippled/uneven/irregular/corrugated surface may be formed between two layers due to a difference in the moduli of elasticity of the two layers. That is, a curved surface may be spontaneously formed at an upper surface of the first layer 410b and at a lower surface of the second layer 430b, which is located on the first layer 410b, due to thin film stresses, and without performing an additional process. The curved surface might not have a regular periodic structure or a regular shape, but may be an irregular surface.

According to the organic light-emitting display device 6000 of the present exemplary embodiment, a curved surface is formed between the first layer 410b and the second layer 430b formed in the thin film encapsulation unit 300, and thus, lateral visibility (WAD) may be improved as light emitted from the display unit 200 is transmitted to the outside and perceived by the eyesight of the user. In other words, light emitted from the display unit 200 may arrive at the curved surface formed in the thin film encapsulation unit 300, and may be irregularly refracted by the curved surface having an irregular form.

Accordingly, unlike a display device in which light is transmitted only linearly, and thus has poor lateral visibility (WAD), according to the exemplary embodiment, light may be refracted at various angles via the curved surface, and thus the lateral visibility (WAD) may be improved.

The first layer 410b and the second layer 430b may each include an organic-inorganic hybrid material (e.g., may each be an organic-inorganic hybrid layer, or may include an organic-inorganic composite material). According to one embodiment, the first layer 410b and the second layer 430b may each include an organic-inorganic hybrid material that is one of hexamethyldisiloxane (HMDSO), hexamethyldisilazane (HMDSN), tetrameyhyldisiloxane (TMDSO), tetraethyl orthosilicate (TEOS), octamethylcyclotetrasiloxane (OMCTS), and tetraoxymethylcyclotetrasiloxane (TOMCTS).

The organic-inorganic hybrid material refers to a composite material having both characteristics of an organic material and characteristics of an inorganic material, from which synergic effects may be rendered by mixing an organic material and an inorganic material. The organic-inorganic hybrid material may be prepared by forming an inorganic network by using an inorganic material, such as a silane-based material, and by forming a hybrid between the inorganic network and an organic polymer.

According to one embodiment, the first layer 410b and the second layer 430b may each include one of HMDSO, HMDSN, TMDSO, TEOS, OMCTS, and TOMCTS. According to the present exemplary embodiment, the first layer 410b and the second layer 430b may additionally collectively function as a planarization layer, which has the characteristics of an organic layer, and as a barrier layer, which has the characteristics of an inorganic layer.

Hereinafter, a method of manufacturing the organic light-emitting display device 1000 according to an exemplary embodiment will be described.

The method of manufacturing the organic light-emitting display device 1000 according to the present exemplary embodiment may include forming a display unit 200 on a substrate 100, and forming a thin film encapsulation unit 300 encapsulating the display unit 200, and the forming of the thin film encapsulation unit 300 may include forming a corrugated portion 400a.

The forming of the corrugated portion 400a may include coating and hardening a first layer 410a that planarizes a lower structure of the display unit 200, and forming a second layer 430a on the first layer 410a, wherein the second layer 430a functions as a barrier layer. In the coating and hardening of the first layer 410a, the first layer 410a may function as a planarization layer, and an upper surface of the first layer 410a may be flat. However, because the second layer 430a, which has a higher modulus of elasticity than the first layer 410a, is formed directly on the first layer 410a, a curved surface may be formed at the upper surface of the first layer 410a and at a lower surface of the second layer 430a due to thin film stresses.

That is, instead of additionally forming a curve in an interface between the first layer 410a and the second layer 430a, when the second layer 430a is formed directly on the first layer 410a to contact the upper surface of the first layer 410a, a curved surface may be spontaneously formed due to a difference in the moduli of elasticity of the first layer 410a and the second layer 430a. Thus, as an additional operation of forming a curved surface is not needed, manufacturing time and economic cost may be reduced.

In addition, as a curved surface is formed between the first layer 410a and the second layer 430a, emitted light is irregularly refracted to thereby improve lateral visibility (WAD).

According to one or more exemplary embodiments of the inventive concept, lateral visibility (WAD) of an organic light-emitting display device may be improved.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims, and their equivalents.

What is claimed is:

1. An organic light-emitting display device comprising:
   a substrate;
   a display unit on the substrate; and
   a thin film encapsulation unit configured to encapsulate the display unit, and comprising a corrugated portion comprising a first layer and a second layer that are sequentially stacked,
   wherein the first layer has a lower modulus of elasticity than the second layer,
   wherein a corrugated surface is formed at an upper surface of the first layer and a lower surface of the second layer,
   wherein the first layer includes a first surface opposite to the corrugated surface,
   wherein the second layer includes a second surface opposite to the corrugated surface,
   wherein the first layer and the second layer include identical materials, and
   wherein light emitted from the display unit passes through both the first surface and the second surface and is transmitted to an outside.

2. The organic light-emitting display device of claim 1, wherein the first layer comprises an organic layer or an inorganic layer.

3. The organic light-emitting display device of claim 1, wherein the second layer comprises an organic layer or an inorganic layer.

4. The organic light-emitting display device of claim 1, wherein the first layer comprises one or more of acrylate, epoxy, silicone, or silicone acrylate.

5. The organic light-emitting display device of claim 1, wherein the second layer comprises one or more of SiNx, SiOx, SiON, SiCN, TiOx, WOx, SiOxCy, or SiOxCyHz.

6. The organic light-emitting display device of claim 1, wherein the second layer comprises one or more of acrylate, epoxy, silicone, or silicone acrylate.

7. The organic light-emitting display device of claim 1, wherein the thin film encapsulation unit further comprises a second corrugated portion.

8. The organic light-emitting display device of claim 1, wherein the first layer and the second layer each comprise an organic-inorganic hybrid layer.

9. The organic light-emitting display device of claim 8, wherein the first layer and the second layer each comprise an organic-inorganic composite material comprising one or more of HMDSO, hexamethyldisilazane (HMDSN), tetrameyhyldisiloxane (TMDSO), tetraethyl orthosilicate (TEOS), octamethylcyclotetrasiloxane (OMCTS), or tetraoxymethylcyclotetrasiloxane (TOMCTS).

10. The organic light-emitting display device of claim 1, wherein the corrugated surface is irregular.

11. The organic light-emitting display device of claim 1, wherein curves of the corrugated surface have a period of about 2 μm or less and a depth of about 4 μm or less.

* * * * *